United States Patent [19]

Beyer et al.

[11] Patent Number: 5,391,911
[45] Date of Patent: Feb. 21, 1995

[54] REACH-THROUGH ISOLATION SILICON-ON-INSULATOR DEVICE

[75] Inventors: Klaus D. Beyer, Poughkeepsie; Andrie S. Yapsir, Pleasant Valley, both of N.Y.

[73] Assignee: International Business Machines Corporation, Armonk, N.Y.

[21] Appl. No.: 231,100

[22] Filed: Apr. 22, 1994

Related U.S. Application Data

[62] Division of Ser. No. 37,855, Mar. 29, 1993, Pat. No. 5,306,659.

[51] Int. Cl.⁶ .................... H01L 21/76; H01L 27/04
[52] U.S. Cl. .................... 257/522; 257/347; 257/353; 257/506; 257/524
[58] Field of Search ............... 257/347, 353, 354, 506, 257/522, 524

[56] References Cited

U.S. PATENT DOCUMENTS

| | | | |
|---|---|---|---|
| 4,104,090 | 8/1978 | Pogge | 148/175 |
| 4,169,000 | 9/1979 | Riseman | 148/187 |
| 4,418,470 | 12/1983 | Naster et al. | 29/577 |
| 4,502,913 | 3/1985 | Lechaton et al. | 156/643 |
| 4,661,832 | 4/1987 | Lechaton et al. | 357/49 |
| 4,888,300 | 12/1989 | Burton | 437/61 |
| 5,057,450 | 10/1991 | Bronner et al. | 437/62 |
| 5,227,658 | 7/1993 | Beyer et al. | 257/522 |

OTHER PUBLICATIONS

P. E. Cade et al, "Methods of Producing Single-Crystal Silicon on Silicon Dioxide", IBM Technical Disclosure Bulletin, vol. 28, No. 5, Oct. 1985, pp. 1855–1856.
H. Horie et al., "A New SOI Fabrication Technique for Ultrathin Active Layer of Less the 80 nm", 1990 IEEE Symposium on VLSI Technology, pp. 93–94, 1990.

*Primary Examiner*—Jerome Jackson
*Assistant Examiner*—Nathan K. Kelley
*Attorney, Agent, or Firm*—Michael J. Balconi-Lamica

[57] ABSTRACT

A method and the resulting product for isolating lightly doped silicon islands from each other and from a common substrate. The substrate is covered with a first heavily doped epi layer. The first layer is covered with a lightly doped second epi layer. A pair of spaced deep trenches are provided which extend from the top surface of the second layer, through the first layer and into the substrate. The interior walls of the trenches are lined with oxide. A pair of heavily doped reach-through diffusions extending from said top surface to the first layer is oriented perpendicularly to the deep trenches and fully extends between the trenches. The heavily doped reach-through diffusions and the contiguous first layer are removed by a single anisotropic etching step to yield silicon islands isolated by air except where the islands contact the oxide-lined deep trenches. The air isolation preferably is partially replaced with other dielectric material.

8 Claims, 2 Drawing Sheets

5,391,911

REACH-THROUGH ISOLATION SILICON-ON-INSULATOR DEVICE

This is a divisional application of application Ser. No. 08/037,855, filed Mar. 29, 1993, U.S. Pat. No. 5,306,659.

BACKGROUND OF THE INVENTION

The present invention generally relates to silicon-on-insulator semiconductor device structures and methods and, more particularly, to a simplified undercut etching method based on the use of doped reach-through regions to isolate such device structures from each other on the same chip.

Undercut etching methods to remove selectively a buried doped semiconductive region to form submerged spaces for the insertion of insulating material are well-known in the silicon-on-insulator (SOI) art. The various methods differ in complexity particularly as to how access is gained to reach and remove the buried region and as to how the overlying region (to be isolated) is supported during the process of removing the buried region.

For example, U.S. Pat. No. 4,888,300, issued to Gregory N. Burton on Dec. 19, 1989 for Submerged Wall Isolation of Silicon Islands, teaches the use of trenches in an epitaxial layer to provide access to a differently doped buried layer. While supporting the portion of the epitaxial layer adjacent the trench (by an oxide bridge), the underlying region of the buried layer is etched away to form a cavity under the active area. Five etching steps are disclosed to accomplish the accessing, supporting and removal steps for forming the cavity and for completely isolating the silicon islands from the substrate. Copending patent application, Ser. No. 07/781,429, filed Oct. 23, 1991 in the names of K. D. Beyer et al. for Buried Air Dielectric Isolation of Silicon Islands and assigned to the present assignee also utilizes trench and oxide bridging steps to provide for the accessing and removal of the buried region material while supporting the active area. Three etching steps are disclosed for forming completely isolated silicon islands.

SUMMARY OF THE INVENTION

One object of the present invention is to eliminate the need to etch a trench, as previously taught to access and to remove a buried region underlying each island, in order to isolate each island on the same silicon chip.

Another object of the present invention is to eliminate the need to provide an oxide bridge to support each island while a buried region underlying each island is removed.

These and other objects of the invention are achieved by providing a pair of spaced deep trenches for defining one dimension of each silicon island to be isolated from a common substrate. The trenches extend from the top surface of a lightly doped silicon layer into the silicon substrate and completely through an intervening heavily doped silicon layer. The interior walls of the trenches are lined with an insulating material such as thermal oxide. A pair of heavily doped reach-through diffused areas, running fully perpendicularly between the aforesaid trenches and extending from said top surface to said intervening layer, define a second dimension of each silicon island. The third dimension of each island is established by the thickness of the aforesaid lightly doped silicon layer.

The heavily doped intervening layer and reach-through diffused areas are removed by a single anisotropic etching step which selectively attacks only the heavily doped regions to the exclusion of the lightly doped and the oxidized regions.

BEST MODE FOR CARRYING OUT THE INVENTION

Figure 1:
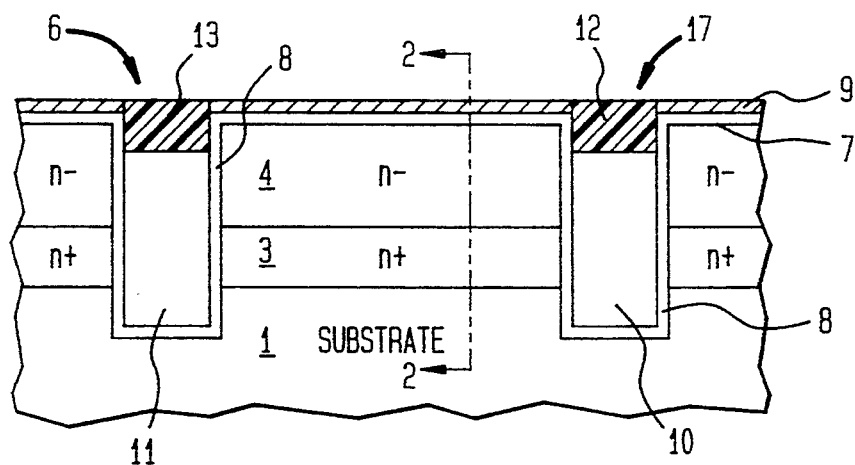
FIG. 1 is a simplified partial cross-sectional view of the partially completed structure of a preferred embodiment showing the lined deep trenches and the layered silicon structure utilized in the present invention.

Referring to FIG. 1, silicon substrate 1 is covered by heavily doped (N+) epitaxial layer 3 and overlying lightly doped (N−) epi layer 4. The conductivity type of substrate 1 is not important in that it is not utilized to form a p-n isolation junction with layer 3. Layer 3 is replaced by dielectric material, including air, to provide isolation in a manner to be described later. A pair of spaced deep trenches 17 and 6 define one dimension of a set of isolated silicon islands to be formed in the intervening epi layer 4 separating said trenches. Each trench extends from the top surface 7 of epi layer 4, through epi layer 3 and into substrate 1. The interior walls of trenches 17 and 6, as well as the top surface 7 of epi layer 4, are covered by thermal oxide 8. A layer 9 of $Si_3N_4$ covers the top surface portion of oxide 8. The trenches preferably are filled with material 10, 11 such as polysilicon or borosilicate glass and covered with CVD oxide caps 12 and 13.

Figure 2:
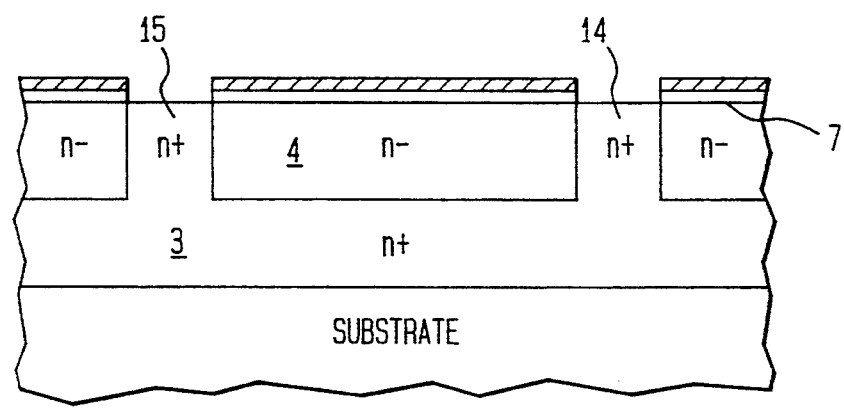
FIG. 2 is a simplified partial cross-sectional view taken along the plane 2—2 of FIG. 1.
Figure 3:
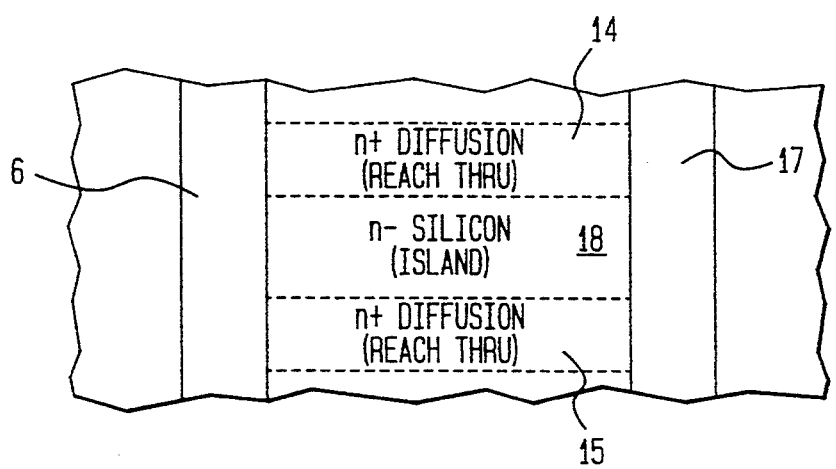
FIG. 3 is a plan view of the chip structure of FIGS. 1 and 2.

The next feature of the present invention is best shown in the fragmentary cross-sectional view of FIG. 2, taken along the plane 2—2 of FIG. 1 and in the plan view of FIG. 3. A pair of heavily doped (N+) reach-through regions 14 and 15 extend from one trench (17) of FIG. 1 to the next trench (6) of FIG. 1 in a direction perpendicular thereto. Regions 14 and 15 also extend from the top surface 7 of epi layer 4 and into contact with heavily doped (N+) epi layer 3. Accordingly, reach-through regions 14 and 15 define a second dimension of each isolated silicon island to be formed in the intervening epi layer 4. The third dimension of each island is established by the thickness of layer 4.

Figure 4:
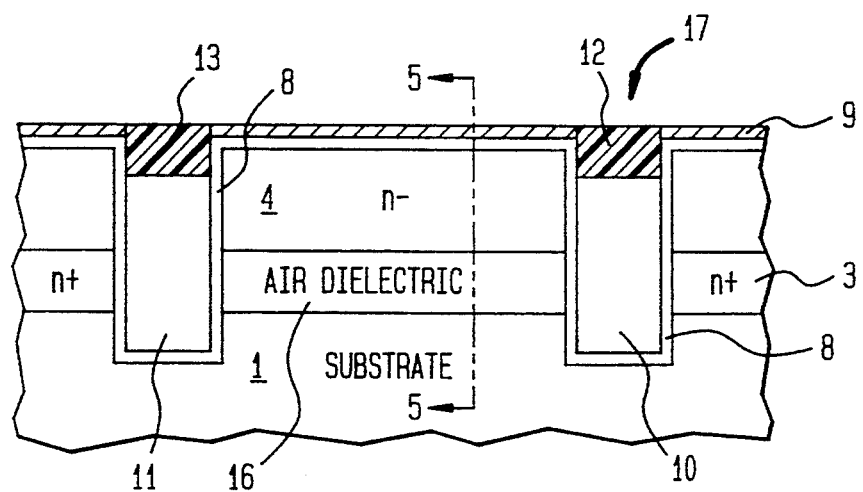
FIG. 4 is a simplified cross-sectional view corresponding to FIG. 1 but after the central heavily doped region thereof has been removed.
Figure 5:
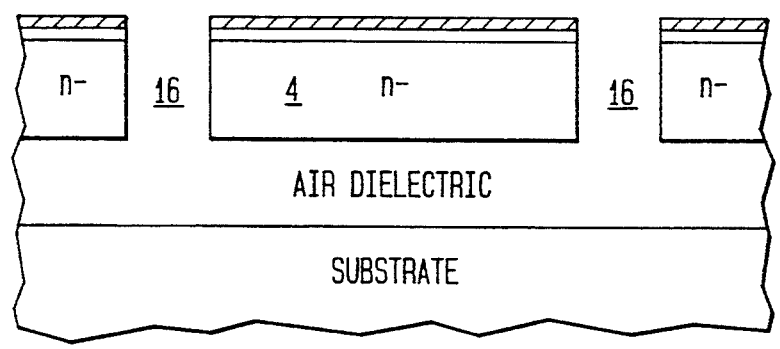
FIG. 5 is a simplified cross-sectional view corresponding to FIG. 2 but after the contiguous heavily doped regions thereof has been removed.

The entire structure is subjected to a single selective plasma etch which preferentially attacks and removes the contiguous N+ heavily doped regions 14, 15 and 3 as shown in FIGS. 4 and 5, leaving voids 16 (air) in those contiguous regions 14, 15 and 3 of FIGS. 1 and 2 previously occupied by N+ silicon. Any suitable well known plasma etch may be used. It should be noted that each silicon island, such as island 18 of FIG. 3, is attached at opposite ends to the oxidized sidewalls 8 of trenches 17 and 6 and are otherwise surrounded by air dielectric 16 whereby each island is isolated from each other and from substrate 1. Formation of the air dielectric cavity is thus advantageously accomplished using only one selective etching step. The space occupied by the air dielectric preferably is partially filled with a combination of CVD silicon dioxide, polysilicon and/or polymeric material such as a polyimide (not shown), if the described isolation process is done at the end of the hot processing steps for the fabrication of structures within the isolated islands. If the isolated islands are formed prior to such hot processing steps, a sufficiently thick CVD silicon oxide cap is required above the combination-filled regions 16. The presence of the buried air dielectric reduces the amount of any thermal stress that might be encountered.

While the invention has been particularly shown and described with reference to the preferred and alternate embodiments thereof, it will be understood by those skilled in the art that various changes in form and detail may be made therein without departing from the spirit and scope of the invention.

What is claimed is:

1. A semiconductor chip having isolated islands comprising:
    a substrate;
    a first heavily doped epitaxial layer on said substrate;
    a second lightly doped epitaxial layer on said first layer;
    a pair of spaced deep trenches defining one dimension of said islands, said deep trenches extending from the top surface of said second layer, through said first layer and into said substrate, each said deep trench having interior walls comprising sidewalls and a bottom surface, the bottom surface being located within said substrate;
    an insulating layer on the interior walls of said deep trenches, said insulating layer extending along the sidewalls of said deep trenches from the top surface of said second layer, through said first layer and into said substrate, said insulating layer further covering the bottom surfaces of said deep trenches; and
    a pair of spaced shallow trenches extending fully between said deep trenches and defining a second dimension of said islands, said shallow trenches extending from the top surface of said second layer to said substrate;
    said first layer covering said substrate except at the locations of said islands, said deep trenches and said shallow trenches;
    said islands being spaced from said substrate by an amount equal to the thickness of said first layer.

2. The chip defined in claim 1 wherein (i) said shallow trenches and (ii) the spaces between said islands and said substrate are filled with dielectric material including air.

3. The chip defined in claim 2 wherein said dielectric material further includes at least one dielectric of the group consisting of silicon dioxide, polysilicon and polymer.

4. The chip defined in claim 1 wherein said first and second layers are N+ and N− doped silicon, respectively.

5. The chip defined in claim 1 wherein a space interior to said insulating layer on the interior walls of each said deep trench is filled with one of the group consisting of polysilicon and borosilicate glass, and further wherein the resulting filled space is capped with silicon dioxide.

6. A semiconductor chip having isolated islands comprising:
    a substrate;
    a first heavily doped epitaxial layer on said substrate, said first heavily doped epitaxial layer comprising N+ doped silicon;
    a second lightly doped epitaxial layer on said first layer, said second lightly doped epitaxial layer comprising N− doped silicon;
    a pair of spaced deep trenches defining one dimension of said islands, said deep trenches extending from the top surface of said second layer, through said first layer and into said substrate, each said deep trench having interior walls comprising sidewalls and a bottom surface, the bottom surface being located within said substrate;
    an insulating layer on the interior walls of said deep trenches, said insulating layer extending along the sidewalls of said deep trenches from the top surface of said second layer, through said first layer and into said substrate, said insulating layer further covering the bottom surfaces of said deep trenches, wherein a space interior to said insulating layer on the interior walls of each said deep trench is filled with one of the group consisting of polysilicon and borosilicate glass, and further wherein the resulting filled space is capped with silicon dioxide; and
    a pair of spaced shallow trenches extending fully between said deep trenches and defining a second dimension of said islands, said shallow trenches extending from the top surface of said second layer to said substrate;
    said first layer covering said substrate except at the locations of said islands, said pair of deep trenches and said pair of shallow trenches;
    said islands being spaced from said substrate by an amount equal to the thickness of said first layer.

7. The chip defined in claim 6 wherein (i) said shallow trenches and (ii) the spaces between said islands and said substrate are filled with dielectric material including air.

8. The chip defined in claim 7 wherein said dielectric material further includes at least one dielectric of the group consisting of silicon dioxide, polysilicon and polymer.

* * * * *